SEMICONDUCTOR TERMINALS AND METHOD

Filed Dec. 2, 1964

INVENTORS.
Howard S. Best
Robert E. Bowser
BY
Walter S. Zebrowski
ATTORNEY

United States Patent Office 3,330,026

Patented July 11, 1967

3,330,026

SEMICONDUCTOR TERMINALS AND METHOD

Howard S. Best and Robert E. Bowser, Raleigh, N.C., assignors to Corning Glass Works, Corning, N.Y., a corporation of New York Filed Dec. 2, 1964, Ser. No. 415,296
4 Claims. (Cl. 29—470.1)

This invention relates to semiconductor devices and more particularly to forming transistor chip terminals, but is in no way limited thereto.

This invention applies to semiconductor devices generally but for the purposes of simplicity it will be described in connection with transistors. Transistors have contacts or contact areas for the collector, emitter, and base. Heretofore, wires were connected between these transistor contacts and external leads embodied within the enclosure in which the transistor was mounted by means of thermo-compression bonding or the like. Such wires had to be individually connected which was very time consuming and consequently very costly. Since the connections are very small it was difficult to make acceptable connections consistently. Furthermore, although the wires were connected at both ends, they were nevertheless free floating in between the ends often resulting in unsound mechanical connections. The free floating portion of these wires was able to move which often caused undue stress to be placed on the rigid welds at the ends thereof and particularly the ends bonded to the transistor contacts. In addition, the bonding itself frequently weakened the wires while the connections were being made.

After the transistor was enclosed, it would be connected to a circuit by means of said external leads which required additional connections that could also fail, as well as additional time and expense. Furthermore, such transistor attachment required much space.

It is an object of the present invention to overcome the hereinabove difficulties and to provide a simple and inexpensive method of forming a transistor chip which can be rapidly, reproducibly, and compactly attached to a circuit whereby failure of mechanical connections between the transistor chip and the circuit is eliminated.

Broadly, according to the present invention a transistor chip having at least one contact plate formed on the surface thereof is provided. A metallic sheet is placed over the contact plate and a vibratory energy tool having a desired tip shape and size is placed in contact with said sheet in register with said contact plate. Vibratory energy is then introduced to the unit so formed by means of said tool, such sheet substantially corresponding in shape to the tool tip and simultaneously bond said pillar to said contact plate. The pillar forms a transistor chip terminal which can thereafter be directly bonded to a circuit by means of vibratory energy or the like.

Additional objects, features, and advantages of the present invention will become apparent to those skilled in the art, from the following detailed description and the attached drawing on which, by way of example, only the preferred embodiment of the invention is illustrated.

Figure 1:
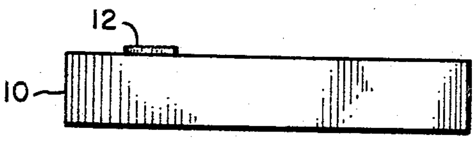
FIGURES 1–4 are side elevations of an article illustrating the various steps in the formation of terminals in accordance with the method of this invention.

Referring to FIGURE 1, a transistor chip 10, of germanium, silicon, or the like material is provided with a metallic contact area or contact plate 12 formed on a flat surface thereof. Contact plate 12 makes electrical contact with any of the transistor emitter, collector, or base electrodes and is formed by selective vapor deposition, metallizing, or like methods well known to one familiar with the art. Examples of suitable contact plate materials are aluminum, gold, platinum and the like.

Figure 2:
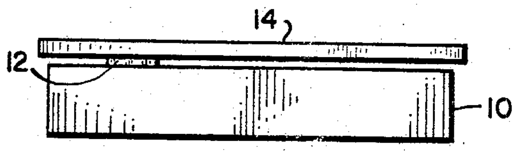
Figures 3, 4, 5:
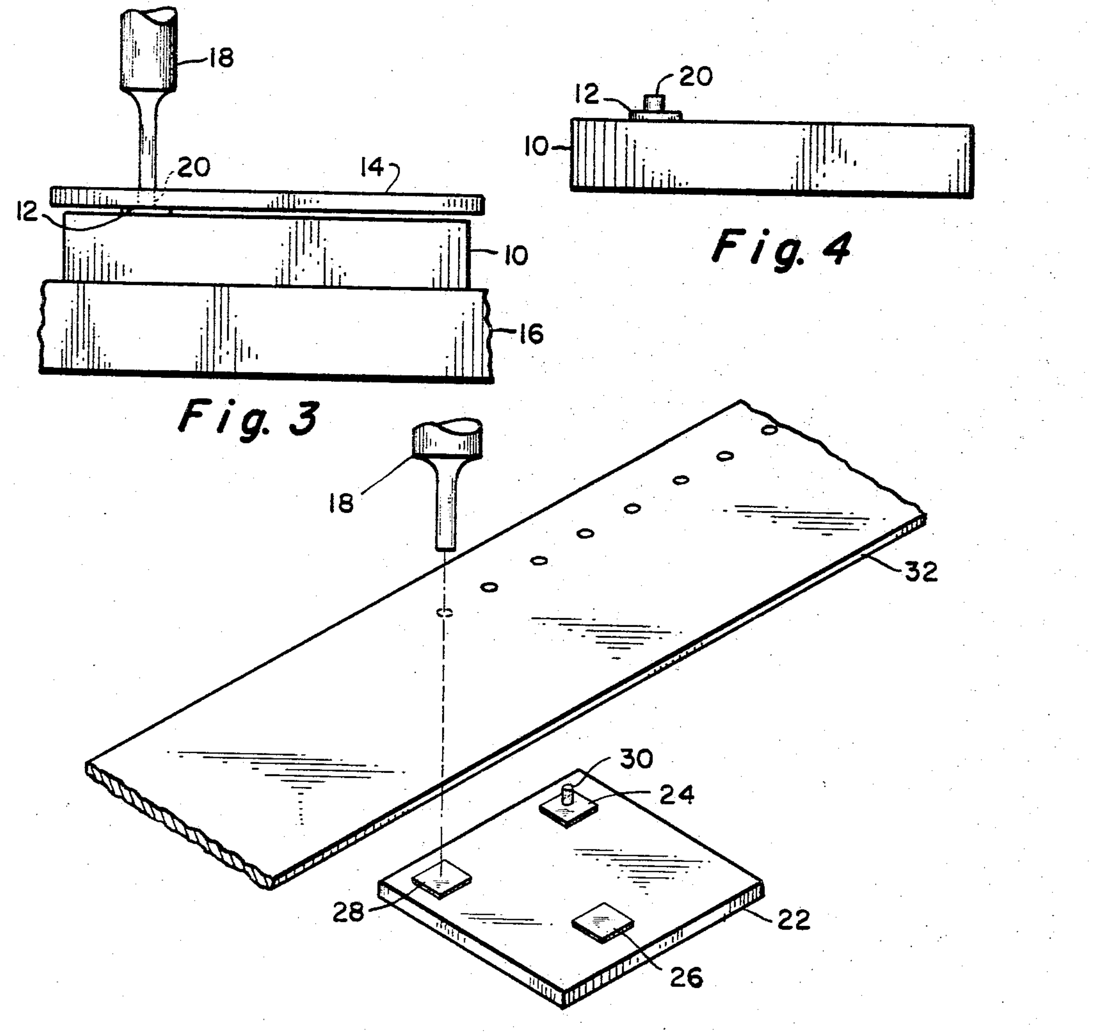
FIGURE 5 is an exploded view illustrating the method of forming a terminal and bonding it to a contact area of a transistor chip in accordance with this invention.

A metallic sheet or ribbon 14 is placed over contact plate 12 as illustrated in FIGURE 2. Suitable ribbon materials are aluminum, gold, platinum, copper and the like. The assembly so formed is placed on anvil 16 and tool 18 is brought into contact with ribbon 14 in alignment with contact plate 12 as illustrated in FIGURE 3. Tool 18 is formed with the surface thereof in contact with ribbon 14 being smooth and parallel to the surface of chip 10 on which contact plate 12 is formed and in turn parallel to contact plate 12, while the longitudinal axis of tool 18 is perpendicular to said surface of chip 10. When vibratory energy is introduced to tool 18, it cuts, punches, or shears a pillar 20 from ribbon 14 in a shape or configuration corresponding substantially to that of the contacting end of tool 18 and simultaneously bonds pillar 20 to contact plate 12 by means of vibratory energy.

When tool 18 and ribbon 14 are removed, a transistor chip having a terminal in the form of pillar 20 remains, as illustrated in FIGURE 4. Pillar 20 is suitably shaped and firmly bonded to contact plate 12.

FIGURE 5 shows a transistor chip 22 having contact plates 24, 26, and 28 formed on one surface thereof, and pillar 30 cut from ribbon 32 and bonded to contact plate 24 by means of tool 18. Ribbon 32 is shown displaced so that a second pillar may be cut from an uncut portion thereof and bonded to contact plate 28. This procedure may be repeated as many times as is necessary to form and bond as many pillars as is desirable.

A typical example of the present invention is illustrated by the following. A suitable contact plate of aluminum may be vapor deposited onto a silicon transistor chip. A vibratory energy tool may be prepared having a contacting end or tip 0.004 inch in diameter. The tip is honed until it is flat-faced, square-edged, and smooth. The tool may then be placed in a suitable vibratory energy apparatus, such for example as Model W–260TSL manufactured by Sonobond Corporation, West Chester, Pennsylvania. The tool is disposed so that its longitudinal axis is perpendicular to the surface of the transistor chip upon which the contact plate is formed and the end surface of the tool is parallel to said transistor surface.

A sheet of aluminum having a thickness of 0.002 inch is placed over the contact plate and the tool is brought into contact with said sheet with a clamping force of approximately 8 ounces. Vibratory energy may then be introduced for approximately 0.150 second whereupon a pillar of aluminum having a configuration corresponding to the tool tip will be cut from the sheet and simultaneously bonded to the contact plate forming a terminal for the transistor chip.

Power requirements for the cutting and bonding will vary with the type of material used, the thickness of the sheet material, the vibratory apparatus used and like conditions, and may be readily selected by one familiar with the art.

A transistor chip with terminals formed in accordance with this invention may thereafter be bonded to a printed circuit for example, by vibratory energy bonding.

Although the invention was described in connection with forming terminals on transistor chips, it will be understood that such terminals can also be formed on other electronic devices such as miniature integrated circuits, semiconductors, diodes, and the like.

Although the present invention has been described with respect to specific details of certain embodiments thereof, it is not intended that such details be limitations upon the scope of the invention except insofar as set forth in the following claims.

We claim:

1. The process of forming a terminal on a transistor chip comprising the steps of providing a transistor chip having a metallic contact plate on a flat surface thereof, superimposing a metallic sheet on and in face-to-face contact with said contact plate, providing a vibratory energy tool having a flat-faced, square-edged contacting tip of a predetermined shape and size, disposing said tool over said sheet in register with said contact plate with the contacting tip surface thereof in parallel arrangement with said flat surface of said chip, contacting said sheet with said tip and applying pressure, and introducing ultrasonic vibratory energy through said tool to the unit so formed sufficient to cut a pillar from said sheet corresponding in shape and size to said tip and simultaneously bond said pillar to said contact plate.

2. The process of claim 1 wherein the contact plate is formed of material selected from the group consisting of aluminum, gold, and platinum.

3. The process of claim 2 wherein the metallic sheet is formed of material selected from the group consisting of aluminum, gold, platinum, and copper.

4. The process of forming a terminal on an electronic device comprising the steps of providing an electronic device having a metallic contact plate on a flat surface thereof, superimposing a metallic sheet on and in face-to-face contact with said contact plate, providing a vibratory energy tool having a flat-faced, square-edged contacting tip, disposing said tool over said sheet in register with said contact plate with the contacting tip surface thereof in parallel arrangement with said flat surface of said chip, contacting said sheet with said tip and applying pressure, and introducing ultrasonic vibratory energy through said tool to the unit so formed sufficient to cut a pillar from said sheet corresponding in shape and size to said tip and simultaneously bond said pillar to said contact plate.

References Cited

UNITED STATES PATENTS 3,235,945 2/1966 Hall -------------- 29—155.5

3,255,511 6/1966 Weissenstern ------- 29—155.5

WILLIAM I. BROOKS, *Primary Examiner.*